United States Patent
Lee et al.

(10) Patent No.: US 9,252,658 B2
(45) Date of Patent: Feb. 2, 2016

(54) LEVEL-CROSSING BASED CIRCUIT AND METHOD WITH OFFSET VOLTAGE CANCELLATION

(71) Applicant: Massachusetts Institute of Technology, Cambridge, MA (US)

(72) Inventors: Sunghyuk Lee, Cambridge, MA (US); Hae-Seung Lee, Lexington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 659 days.

(21) Appl. No.: 13/651,065

(22) Filed: Oct. 12, 2012

(65) Prior Publication Data

US 2015/0263606 A1    Sep. 17, 2015

Related U.S. Application Data

(60) Provisional application No. 61/547,243, filed on Oct. 14, 2011.

(51) Int. Cl.
*H03L 5/00* (2006.01)
*H02M 3/04* (2006.01)

(52) U.S. Cl.
CPC ........................... *H02M 3/04* (2013.01)

(58) Field of Classification Search
CPC .. H03F 3/45475; H03F 3/45183; H03K 5/003
USPC ........... 327/307, 94, 91, 95–97, 554, 50, 337, 327/63, 77, 362, 78; 330/9
See application file for complete search history.

(56) References Cited

U.S. PATENT DOCUMENTS

| | | | |
|---|---|---|---|
| 7,486,115 B2 | 2/2009 | Lee | |
| 7,843,233 B2 | 11/2010 | Lee | |
| 2007/0222483 A1* | 9/2007 | Lee | ................................. 327/94 |

OTHER PUBLICATIONS

Brooks, L et al., "A 12b 50MS/s fully differential zero-crossing based ADC without CMFB," ISSCC Dig. Tech Papers, Feb. 2009, pp. 166-167, 167a, IEEE.
Chu, J. et al., "A zero-crossing based 12b 100MS/s pipelined ADC with decision boundary gap estimation calibration," IEEE Symposium on VLSI Circuits, Jun. 2010, pp. 237-238, IEEE.
Chow, A. et al., "Offset cancellation for zero crossing based circuits," Proceedings of 2010 IEEE International Symposium on Circuits and Systems (ISCAS), pp. 1719-1722.

* cited by examiner

*Primary Examiner* — Lincoln Donovan
*Assistant Examiner* — Thomas Skibinski
(74) *Attorney, Agent, or Firm* — Withrow & Terranova, P.L.L.C.

(57) ABSTRACT

A level-crossing based circuit with offset voltage cancellation includes a first level-crossing detector section having a first output capacitor, wherein the first level-crossing section is configured to charge the first output capacitor to a first voltage corresponding to an input signal. The first voltage includes a first offset voltage. The level-crossing based circuit also includes a second level-crossing detector section having a second output capacitor, wherein the second level-crossing detector section is configured to discharge the second output capacitor to a second voltage corresponding to the input signal such that the second voltage includes a second offset voltage that is substantially equal in magnitude to the first offset voltage and opposite in polarity to the first offset voltage relative to an average of the first voltage and the second voltage.

20 Claims, 8 Drawing Sheets

LEVEL-CROSSING BASED CIRCUIT AND METHOD WITH OFFSET VOLTAGE CANCELLATION

RELATED APPLICATIONS

This application claims the benefit of U.S. provisional patent application No. 61/547,243, filed Oct. 14, 2011, the disclosure of which is incorporated herein by reference in its entirety.

GOVERNMENT SUPPORT

This invention was made with government funds under Contract No. HR0011-07-3-0002 awarded by DARPA. The U.S. Government has certain rights in this invention.

FIELD OF THE DISCLOSURE

The present disclosure relates generally to switched capacitor type data sampling circuits and in particular to an offset cancellation technique for level-crossing based circuits used in switched capacitor type data sampling circuits.

BACKGROUND

Conventionally, an operational amplifier (op-amp) is used for accurate charge transfer in switched capacitor circuits. The op-amp has differential inputs and an output. In operation, the op-amp senses the voltage difference at the differential inputs, and drives an output node continuously with its output to achieve a virtual ground condition at the differential inputs. As long as high-gain and wide-bandwidth op-amps are available this method is accurate and robust. However, it is relatively difficult to make power efficient, high-gain, and wide-bandwidth op-amps in nano-scale complementary metal oxide semiconductor (CMOS) technology.

Figure 1A:
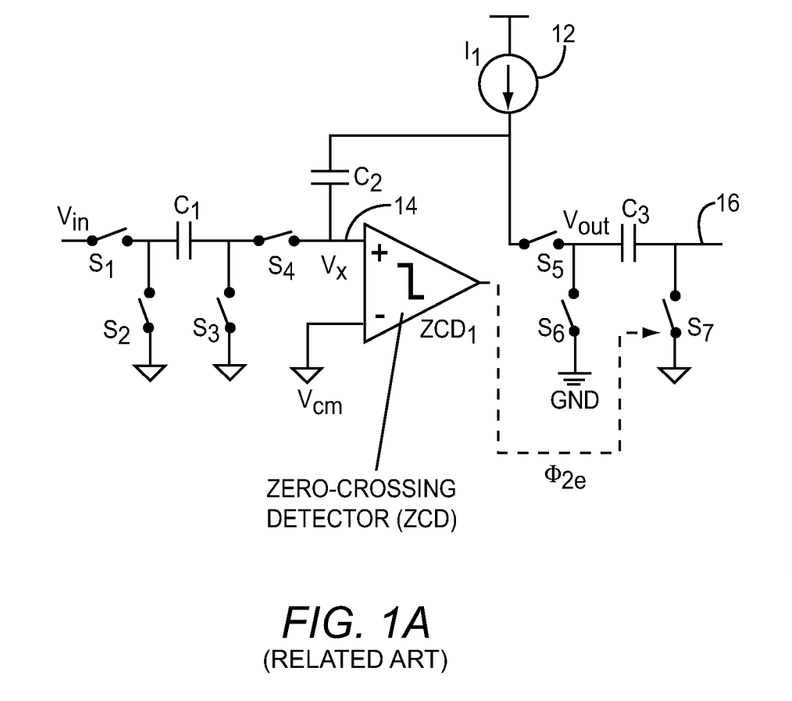
FIG. 1A is a schematic of a related art zero-crossing detector circuit.

A related art zero-crossing based circuit technique replaces the op-amp with a zero-crossing detector and a current source. FIG. 1A is a schematic of an exemplary related art zero-crossing detector based circuit 10. The circuit 10 includes a zero-crossing detector $ZCD_1$ and a current source 12 that supplies a current $I_1$. The circuit 10 also includes switches $S_1$, $S_2$, $S_3$, $S_4$, $S_5$, $S_6$, and $S_7$ along with capacitors $C_1$, $C_2$, and $C_3$. A switch controller (not shown) controls the opening and closing of switches $S_1$ through $S_6$. The switch $S_7$ is opened and closed in response to the output state of the zero-crossing detector $ZCD_1$.

Figure 1B:
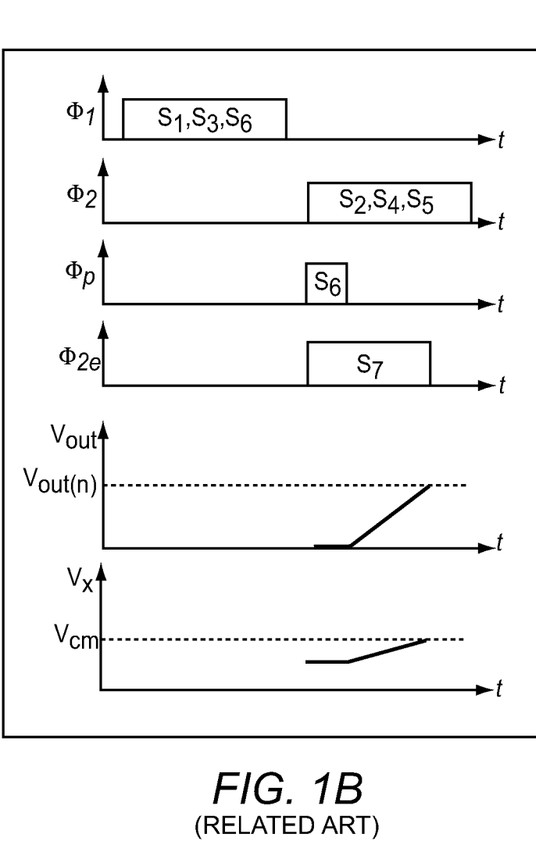
FIG. 1B is a series of graphs depicting switching phases, an output voltage, and a virtual ground node voltage for the related art zero-crossing detector circuit of FIG. 1A.

FIG. 1B is a series of graphs depicting switching phases $\phi_1$, $\phi_2$, $\phi_p$, and $\phi_{2e}$, along with an output voltage $V_{out}$, and a virtual ground node voltage $V_X$ for the circuit 10 (FIG. 1A). In operation, the circuit 10 samples an input signal ($V_{in}$) that is applied to the capacitor $C_1$ by closing switches $S_1$ and $S_3$. Switches $S_2$ and $S_4$ are open during this sampling period. This sampling step is similar to a sampling step used in the operation of traditional op-amp based switched capacitor circuits. Optionally, the switch $S_6$ may be closed during the sampling period to ensure that the output voltage $V_{out}$ is at ground potential (GND). After the sampling period, the capacitor $C_1$ and the second capacitor $C_2$ are selectably coupled to a virtual ground node 14 that includes an input of the zero-crossing detector $ZCD_1$ by closing the switches $S_2$ and $S_4$. As a result, a charge accumulated by the capacitor $C_1$ from $V_{in}$ is transferred to the second capacitor $C_2$. The charge transfer starts in response to the preset phase $\phi_p$, which initializes the output voltage $V_{out}$ to GND via the switch $S_6$. After the preset phase $\phi_p$ concludes, the current source 12 begins charging the output capacitor $C_3$ with the current $I_1$. The zero-crossing detector $ZCD_1$ monitors the virtual ground node 14, while the current $I_1$ is charging the output capacitor $C_3$. The zero-crossing detector $ZCD_1$ detects the instant of the zero-crossing of the virtual ground node voltage $V_x$, and opens the switch $S_7$ coupled to a terminal node 16. As such, the voltage $V_{out}$ and the virtual ground node voltage $V_x$ increase linearly in time and stop once a virtual ground condition $V_{cm}$ (common mode voltage) is met. The circuit 10 is power efficient because the zero-crossing detector $ZCD_1$ is significantly more power efficient than a high-gain wide-bandwidth op-amp typically used in circuits having the same function as circuit 10. Moreover, the circuit 10 eliminates stability issues, due to semi-open loop operation.

Figure 2A:
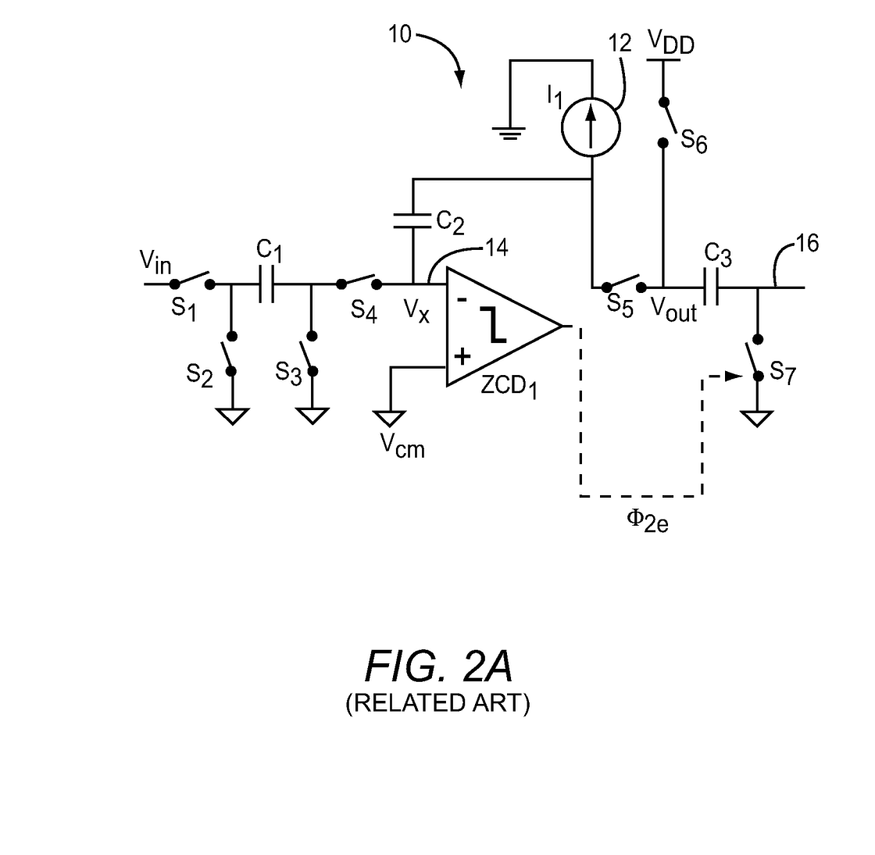
FIG. 2A is a schematic of a modified version of the related art zero-crossing detector circuit of FIG. 1A having a reversed direction current source.
Figure 2B:
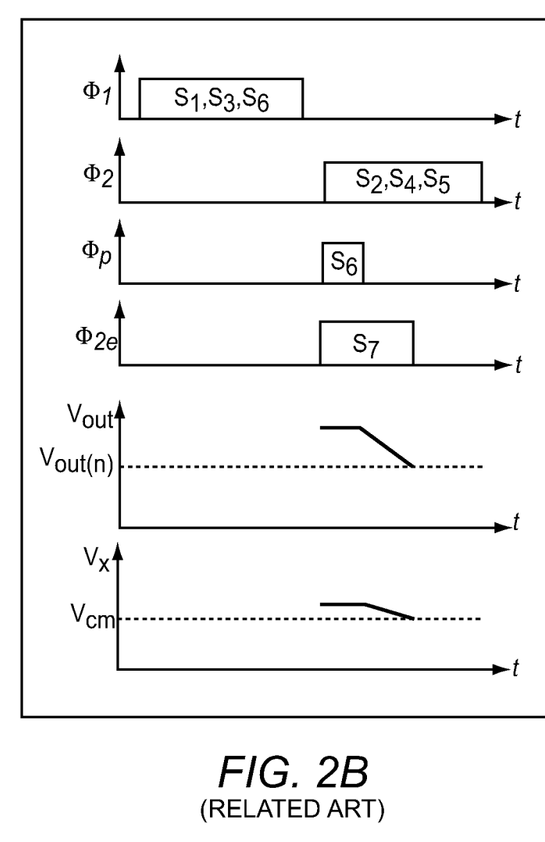
FIG. 2B is a series of graphs depicting switching phases, an output voltage, and a virtual ground node voltage for the related art zero-crossing detector circuit of FIG. 2A.

FIG. 2A is a schematic of a modified version of the related art zero-crossing detector circuit 10 of FIG. 1A having a reversed direction current source. For example, charge transfer operations of zero-crossing based circuits can be done in an opposite direction of the current source 10 shown in FIG. 1A. A configuration for an opposite output charging direction is depicted in FIG. 2A. In this case, the output voltage $V_{out}$ is initialized to a supply voltage $V_{DD}$ instead of GND during the preset phase ($\phi_p$) by the preset switch $S_6$. In this configuration the preset switch $S_6$ is coupled between a source of the supply voltage $V_{DD}$ and a node between the switch $S_5$ and a first terminal of the capacitor $C_3$. In operation, the zero-crossing detector $ZCD_1$ monitors the zero crossing at the input of the zero-crossing detector $ZCD_1$ while the current source 12 discharges the output voltage $V_{out}$ via the current $I_1$. FIG. 2B shows a similar operation to FIG. 1B except that the direction of change for the output voltage $V_{out}$ and the virtual ground node voltage $V_x$ are reversed with those shown in FIG. 1B. It may be necessary to switch the two inputs of the zero-crossing detector $ZCD_1$ in cases where a same version of zero-crossing detector $ZCD_1$ is reused in circuit 10 of FIG. 2A.

Figure 3A:
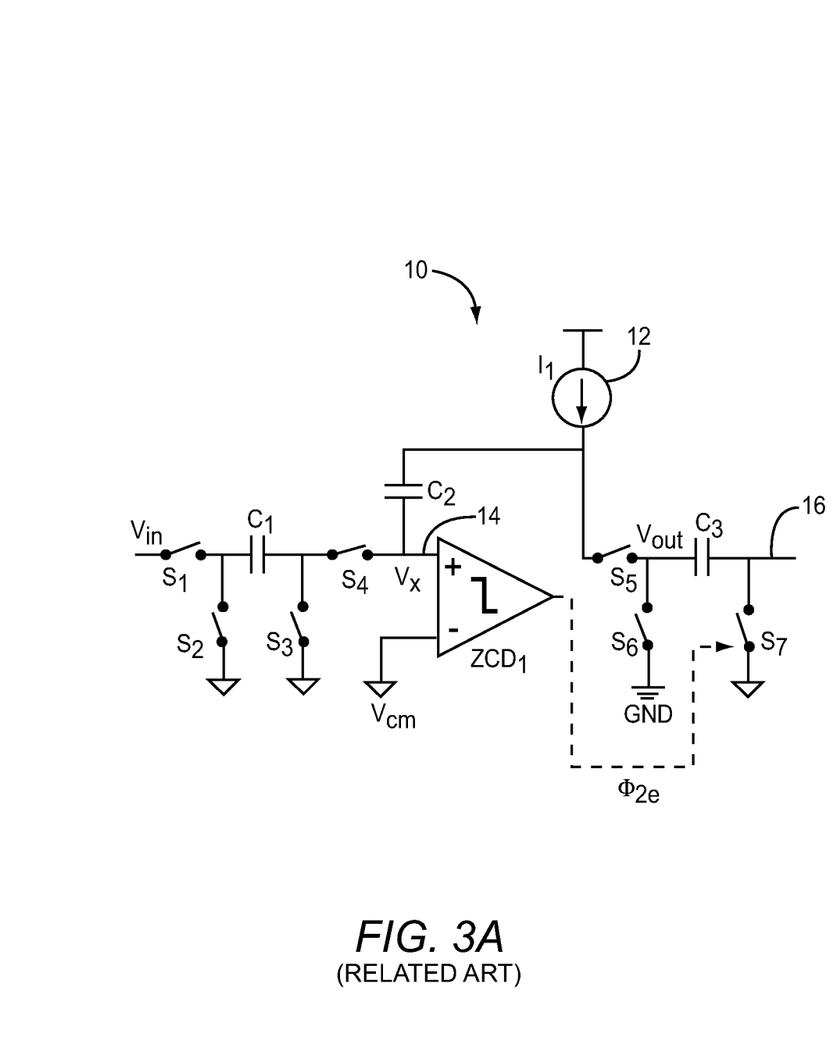
FIG. 3A is a schematic reproduction of the related art zero-crossing detector circuit of FIG. 1.

For the following discussion FIG. 3A is a schematic reproduction of the related art zero-crossing detector circuit of FIG. 1. The operation aspects of the circuit 10 of FIG. 1A and FIG. 2A are described as ideal operations. In practical terms, the response time between a zero-crossing detection and an output change of the zero-crossing detector 10 and a corresponding switch transition for the switch $S_7$ is not instantaneous. Instead, there is a finite delay ($t_d$) in turning off the switch $S_7$ after a zero-crossing at the input of the zero-crossing detector $ZCD_1$.

Figure 3B:
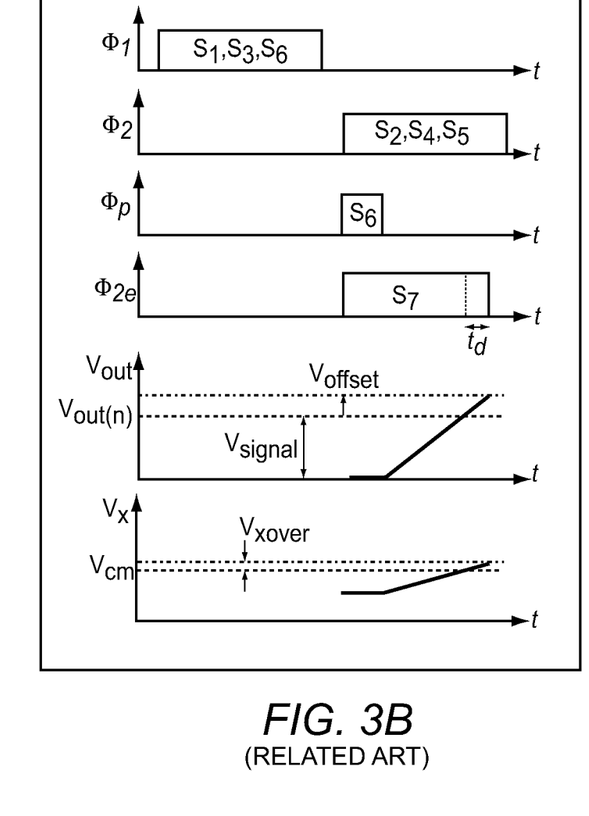
FIG. 3B is a series of graphs depicting switching phases, an output voltage, a virtual ground node voltage, and an offset caused by a delay of the related art zero-crossing detector circuit of FIG. 3A.

FIG. 3B is a series of graphs depicting switching phases $\phi_1$, $\phi_2$, $\phi_p$, and $\phi_{2e}$, along with an output voltage $V_{out}$, a virtual ground node voltage $V_x$ and an offset caused by the delay $t_d$ of the circuit 10 of FIG. 3A. Due to the delay $t_d$, the virtual ground node voltage $V_x$ overshoots an ideal voltage by a voltage overshoot $V_{xover}$ given by $$V_{xover} = t_d \cdot \frac{dV_x}{dt}, \quad (1)$$

which leads to an offset voltage $V_{offset}$ in the output voltage $V_{out}$. The voltage offset $V_{offset}$ is given by $$V_{offset} = t_d \cdot \frac{dVout}{dt}. \quad (2)$$

Therefore, a final output voltage $V_{final}$ is given by $$V_{final} = V_{signal} + V_{offset}, \quad (3)$$

wherein the signal voltage $V_{signal}$ equals an ideal output voltage.

Figure 4A:
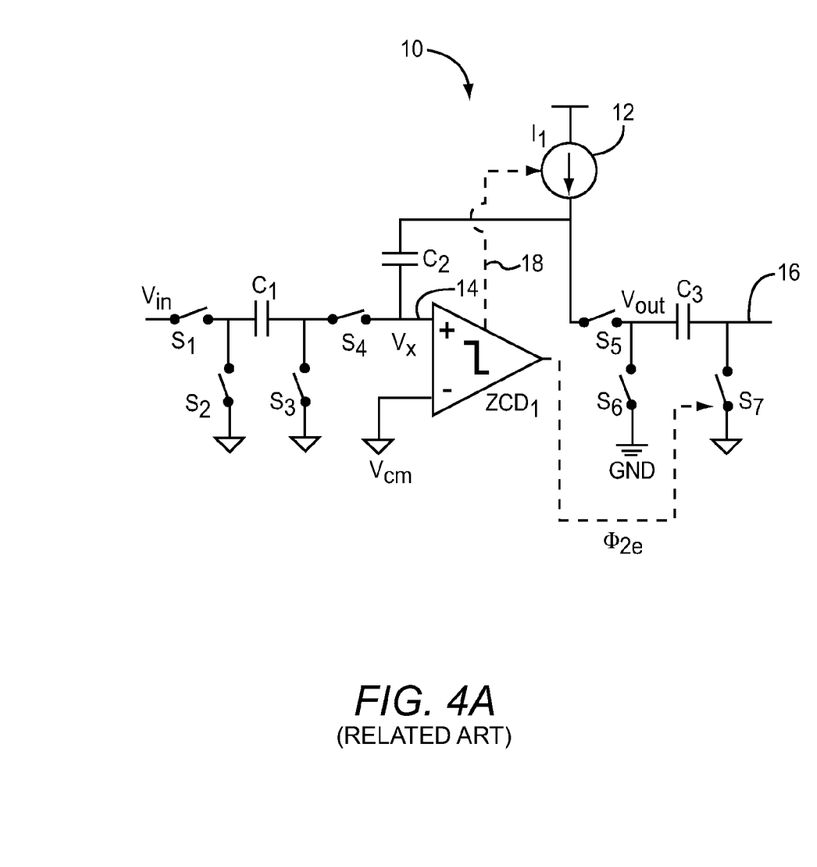
FIG. 4A is a schematic of a related art zero-crossing based circuit for demonstrating a dual phase charge transfer scheme for accurate operation of zero-crossing based circuits.

Related art techniques address the inaccuracy due to the virtual ground node voltage $V_x$ overshoot and the resulting offset voltage $V_{offset}$ by implementing a coarse charge transfer phase followed by a fine charge transfer phase. The goal of this dual phase charge transfer is to reduce the ramp rate right before the zero-crossing detector $ZCD_1$ detects a zero-crossing. In this regard and as shown in FIG. 4A, one related art modification adds a current control 18.

Figure 4B:
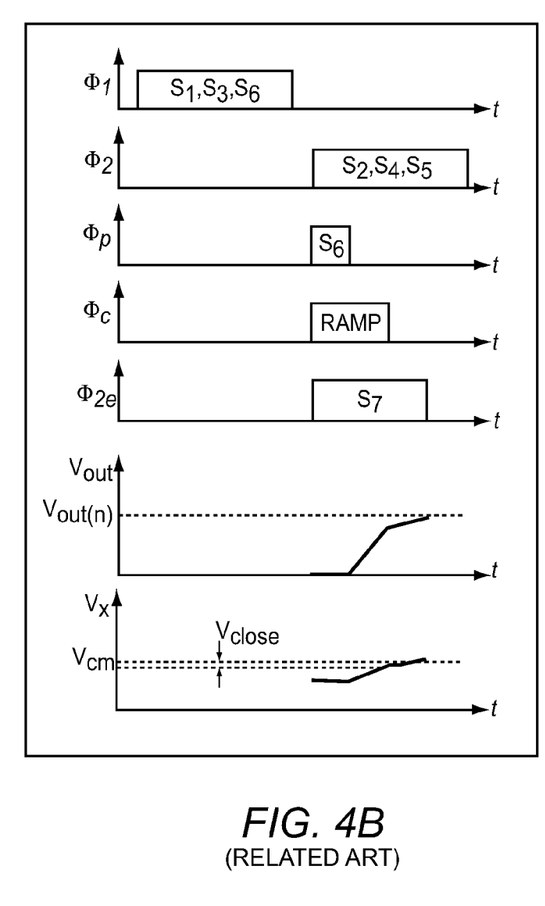
FIG. 4B is a series of graphs depicting switching phases including a phase controlling charge transfer, an output voltage, a virtual ground node voltage, and an offset caused by a delay of the related art zero-crossing detector circuit of FIG. 4A.

As shown in FIG. 4B, a charge transfer begins with a coarse charging phase ($\phi_c$), wherein the current source 12 in response to the current control 18 charges the capacitor $C_3$ relatively quickly via a relatively high current ramp of the current $I_1$. While the current source 12 charges the capacitor $C_3$, the zero-crossing detector $ZCD_1$ detects when the virtual ground node voltage $V_x$ reaches a predetermined voltage level $V_{close}$ that is relatively close to the virtual ground condition $V_{cm}$. Once the virtual ground node voltage $V_x$ reaches the predetermined voltage level $V_{close}$, the current control 18 significantly reduces the relatively high current ramp of the current $I_1$, thereby replacing the coarse charging phase $\phi_c$ with a fine charging phase $\phi_f$. The resulting offset voltage $V_{offset}$ is relatively lower, which results in a relatively greater accuracy of charge transfer to the capacitor $C_2$ and higher accuracy of the output voltage on the capacitor $C_3$. The fine charging phase ends when the virtual ground node voltage $V_x$ crosses the virtual ground condition $V_{cm}$. The charge accumulated by the capacitor $C_3$ is sampled by a following sampling stage (not shown). While the modified circuit 10 of FIG. 4 provides improved accuracy, a small but significant error in the output voltage $V_{out}$ remains due to the smaller but still significant offset voltage $V_{offset}$.

Additional related art techniques to compensate for the offset voltage $V_{offset}$ include employing a programmable offset in the zero-crossing detector $ZCD_1$ and/or coupling a small capacitor array (not shown) to the virtual ground node 14 to cancel the offset voltage $V_{offset}$. However, after considering temperature and process variations, these related art techniques are relatively impractical. What is needed is a level-crossing based circuit and method that provides cancellation of offset voltage and tracking of the offset variation with efficiencies in power consumption and die area.

SUMMARY

The present disclosure provides a level-crossing based circuit with offset voltage cancellation and includes a first level-crossing detector section having a first output capacitor, wherein the first level-crossing detector section is configured to charge the first output capacitor to a first voltage corresponding to an input signal. The first voltage includes a first offset voltage. The level-crossing based circuit also includes a second level-crossing detector section having a second output capacitor, wherein the second level-crossing detector section is configured to discharge the second output capacitor to a second voltage corresponding to the input signal, wherein the second voltage includes a second offset voltage that is substantially equal in magnitude to the first offset voltage, but is opposite in polarity to the first offset voltage relative to an average of the first voltage and the second voltage.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Figure 5A:
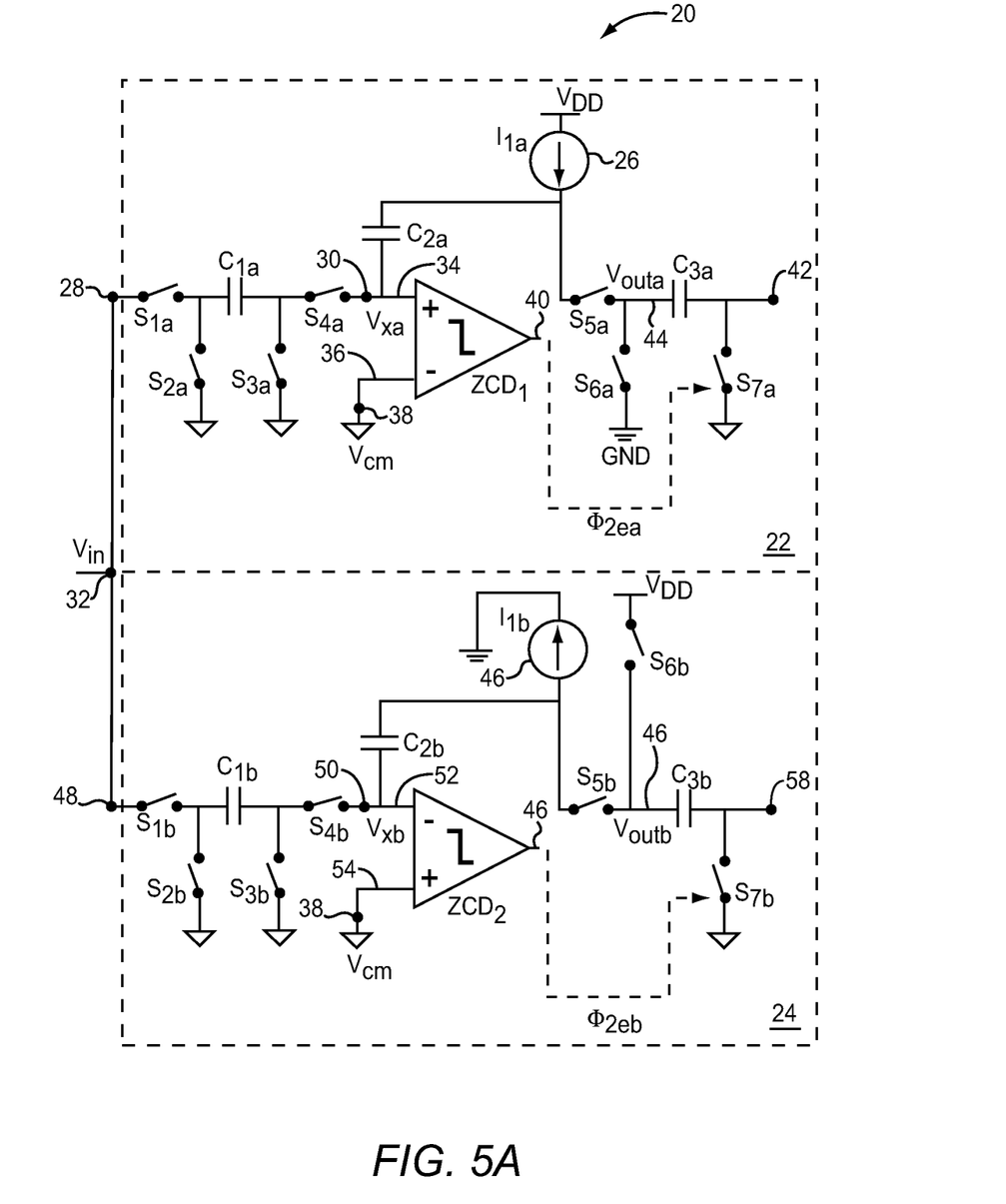
FIG. 5A is a schematic of an embodiment of a level-crossing based circuit that employs a dual phase charge transfer in accordance with the present disclosure.

The present disclosure provides a level-crossing based circuit and method that provides cancellation of offset voltage and tracking of the offset variation with efficiencies in power consumption and die area. FIG. 5A is a schematic of an embodiment of a level-crossing based circuit 20 that employs a dual phase charge transfer in accordance with the present disclosure. The level-crossing based circuit 20 has a first level-crossing detector section 22 and a second level-crossing detector section 24.

Figure 5B:
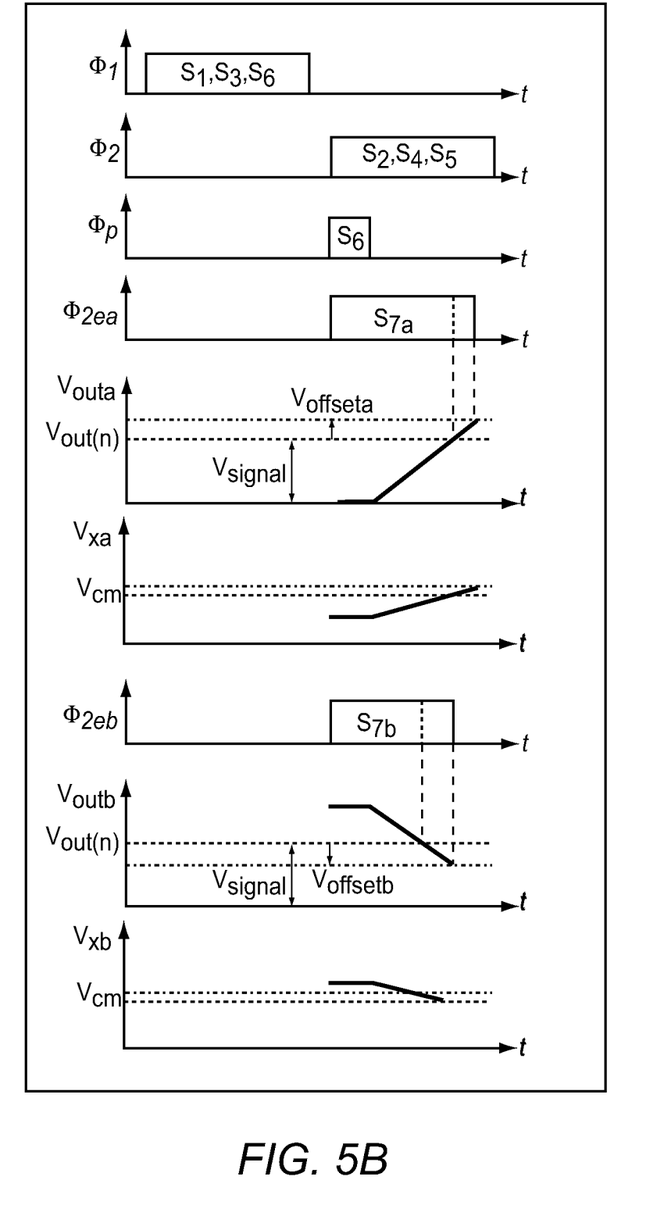
FIG. 5B is a series of graphs depicting switching phases, output voltages, and virtual ground node voltages for the embodiment of the zero-crossing detector circuit of FIG. 5A.

The first level-crossing detector section 22 includes switches $S_{1a}$, $S_{2a}$, $S_{3a}$, $S_{4a}$, $S_{5a}$, $S_{6a}$, and $S_{7a}$, along with capacitors $C_{1a}$, $C_{2a}$, and $C_{3a}$. Also included in the first level-crossing detector section 22 are a first zero-crossing detector $ZCD_1$ and a current source 26. The switches $S_{1a}$-$S_{4a}$ together with the capacitor $C_{1a}$ make up a first switched capacitor network having a first sampling input terminal 28 and a first sampling output terminal 30. The first sampling input terminal 28 is coupled to a signal input terminal 32 that receives an input signal $V_{in}$. The switch $S_{1a}$ acts as a sampling switch during a sampling phase $\phi_1$ as shown in FIG. 5B. During a sampling phase $\phi_1$, the switch $S_{3a}$ is closed so that the capacitor $C_{1a}$ can be charged with a sample voltage corresponding to the input signal $V_{in}$.

The capacitor $C_{2a}$ acts as a charge transfer capacitor when capacitor $C_{1a}$ is selectively coupled to capacitor $C_{2a}$ via switch $S_{4a}$. The first zero-crossing detector $ZCD_1$ has a first virtual ground node input 34 that is coupled to the first sampling output terminal 30. A first common mode input 36 of the first zero-crossing detector $ZCD_1$ is coupled to a common node 38 that is at a common mode voltage $V_{cm}$, wherein $V_{cm}$ is typically at ground potential. The first zero-crossing detector $ZCD_1$ further includes a first detector output 40 that is controllably coupled to the switch $S_{7a}$, which is coupled between a first terminal node 42 and the common node 38. The capacitor $C_{3a}$ is coupled between the first terminal node 42 and a first output node 44.

As shown in FIG. 5B, a control signal $\phi_{2ea}$ selectively closes and opens the switch $S_{7a}$ to first allow charging of the capacitor $C_{3a}$ with the current $I_{1a}$ that is sourced by the first current source 26. The switch phases $\phi_1$, $\phi_2$, and $\phi_p$ apply to switches $S_{1a}$-$S_{6a}$ and $S_{1b}$-$S_{6b}$. Therefore, FIG. 5 refers to these switches generically as switches $S_1$-$S_6$. A control signal $\phi_p$ momentarily closes switch $S_{6a}$ at the beginning of the control signal $\phi_{2ea}$ to preset the charge stored by the capacitor $C_{3a}$ to zero. Note that a switch phase $\phi_2$ closes the switches $S_{2a}$, $S_{4a}$ and $S_{5a}$ during the charging phase $\phi_{2ea}$. As a result, the capacitor $C_{3a}$ provides a first output voltage $V_{outa}$ at the first output node 44 after the zero-crossing detector $ZCD_1$ detects that a first voltage sample $V_{xa}$ of the input signal on the first virtual ground node input 34 exceeds the common mode voltage $V_{cm}$. The first output voltage $V_{outa}$ at the first output node 44 includes a first offset voltage $V_{offseta}$ due to an overshoot of the voltage $V_{xa}$ caused by a delay $t_d$ in turning off the switch $S_{7a}$.

The second level-crossing detector section 24 includes switches $S_{1b}$, $S_{2b}$, $S_{3b}$, $S_{4b}$, $S_{5b}$, $S_{6b}$, and $S_{7b}$, along with capacitors $C_{1b}$, $C_{2b}$, and $C_{3b}$. Also included in the second level-crossing detector section 24 are a second zero-crossing detector $ZCD_2$ and a second current source 46. As disclosed below, the second level-crossing detector section 24 is configured to discharge the capacitor $C_{3b}$ to a second output voltage $V_{outb}$ such that the second output voltage $V_{outb}$ includes a second offset voltage $V_{offsetb}$ that is substantially equal in magnitude and opposite in polarity to the first offset voltage $V_{offseta}$ relative to an average of the first output voltage $V_{outa}$ and the second output voltage $V_{outb}$, which as shown in FIG. 5b is $V_{out(n)}$.

The switches $S_{1b}$-$S_{4b}$ together with the capacitor $C_{1b}$ make up a second switched capacitor network having a second sampling input terminal 48 and a second sampling output terminal 50. The second sampling input terminal 48 is coupled to the signal input terminal 32 that receives the input signal $V_{in}$. The switch $S_{1b}$ acts as a sampling switch during a sampling phase $\phi_1$ as shown in FIG. 5B. During the sampling phase $\phi_1$, the switch $S_{3b}$ is closed so that the capacitor $C_{1b}$ can be charged with a sample voltage corresponding to the input signal $V_{in}$.

The capacitor $C_{2b}$ acts as a charge transfer capacitor when $C_{1b}$ is selectively coupled to $C_{2b}$ via switch $S_{4b}$. The second zero-crossing detector $ZCD_2$ has a second virtual ground node input 52 that is coupled to the second sampling output terminal 50. A second common mode input 54 of the second zero-crossing detector $ZCD_2$ is coupled to the common node 38 that is at a common mode voltage $V_{cm}$, wherein $V_{cm}$ is typically at ground potential. The second zero-crossing detector $ZCD_2$ further includes a first detector output 46 that is controllably coupled to the switch $S_{7b}$, which is coupled between a second terminal node 58 and the common node 38. The capacitor $C_{3b}$ is coupled between the second terminal node 58 and a second output node 60.

As shown in FIG. 5B, a control signal $\phi_{2eb}$ selectively closes and opens the switch $S_{7b}$ to allow discharging of the capacitor $C_{3b}$ with the current $I_{1b}$ that is sourced by the second current source 46. The control signal $\phi_p$ momentarily closes switch $S_{6b}$ at the beginning of the control signal $\phi_{2eb}$ to preset the charge stored by the capacitor $C_{3b}$ to a supply voltage $V_{DD}$. Note that the switch phase $\phi_2$ closes the switches $S_{2b}$, $S_{4b}$, and $S_{5b}$ during the discharging phase $\phi_{2eb}$. As a result, the capacitor $C_{3b}$ provides an output voltage $V_{outb}$ at the second output node 60 after the second zero-crossing detector $ZCD_2$ detects that a second voltage sample $V_{xb}$ of the input signal on the second virtual ground node input 52 falls below the common mode voltage $V_{cm}$.

Figure 6A:
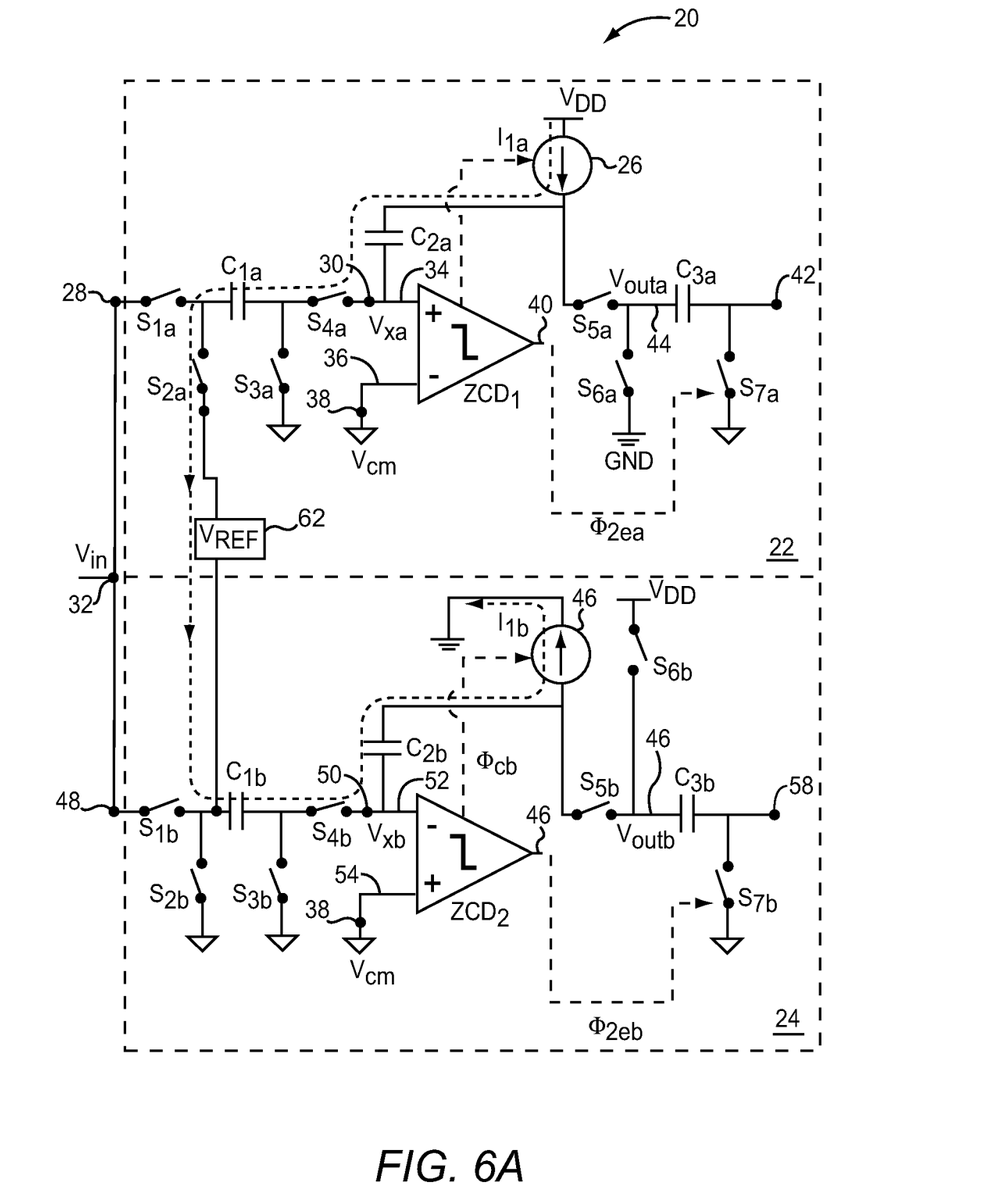
FIG. 6A is a schematic of the embodiment of the level-crossing based circuit of FIG. 5A depicting a current flow through a voltage reference during a fine phase for offset correction.

FIG. 6A is a schematic of a modified embodiment of the level-crossing based circuit 20 of FIG. 5A depicting a current flow through a voltage reference 62 during a fine phase for offset correction. The voltage reference 62 provides a low impedance sink for the first current $I_{1a}$ and an additional low impedance source for the second current $I_{1b}$. As a result, the voltage reference 62 improves the accuracy of the first output voltage $V_{outa}$ and the second output voltage $V_{outb}$ by balancing any mismatches between the first current $I_{1a}$ and the second current $I_{1b}$. Interestingly, the currents $I_{1a}$ and $I_{1b}$ sourced by the first current source 26 and the second current source 46 substantially cancel while passing inside the voltage reference 62. As such, the current rating specification for the voltage reference 62 can be relaxed.

Figure 6B:
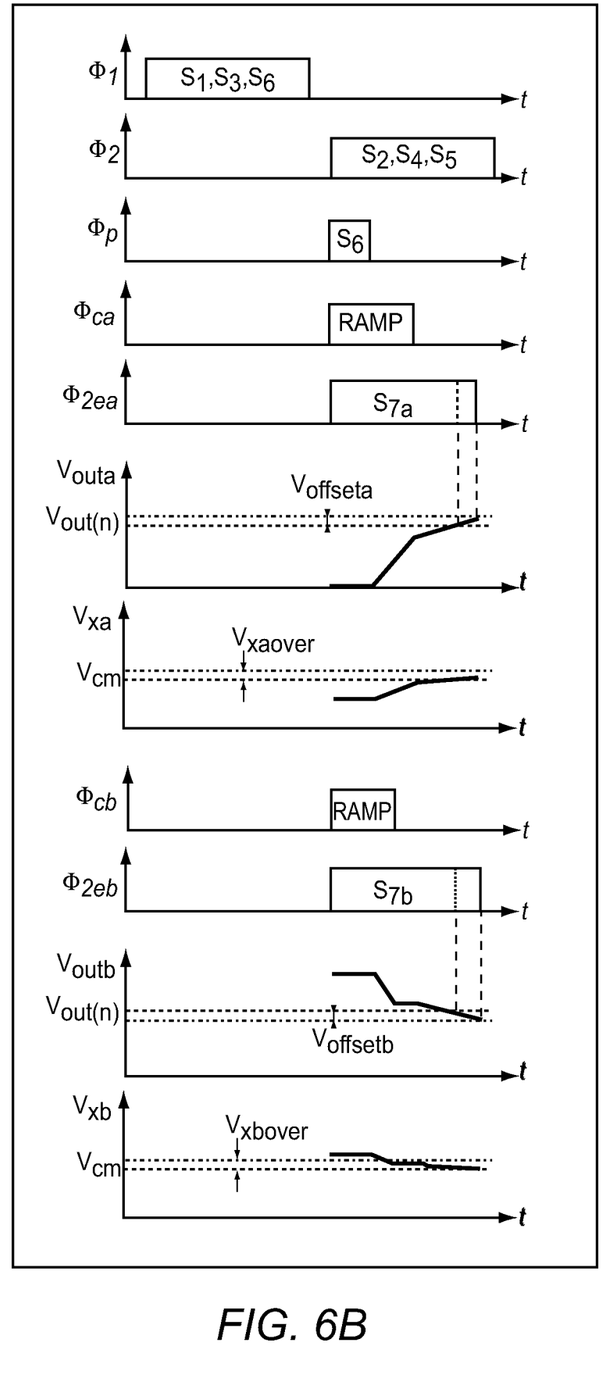
FIG. 6B is a series of graphs depicting switching phases, output voltages, and virtual ground node voltages for the embodiment of the level-crossing based circuit of FIG. 6A during offset cancellation.

FIG. 6B is a series of graphs depicting switching phases, output voltages, and virtual ground node voltages for the embodiment of the level-crossing based circuit 20 of FIG. 6A during offset cancellation. In operation, the capacitor $C_{3a}$ functioning as a first output capacitor is initiated to zero volts by the preset phase $\phi_p$ via the switch $S_{6a}$, and is then charged linearly during a coarse phase $\phi_{ca}$ at a relatively high rate with the current $I_{1a}$ sourced by the first current source 26. The capacitor $C_{3b}$ functioning as a second output capacitor is initialized to a voltage $V_{DD}$ during the preset $\phi_p$ via the switch $S_{6b}$, and is then discharged linearly during a coarse phase $\phi_{cb}$ at a relatively high rate by the current $I_{1b}$ sourced by the second current source 46. Since the coarse phase $\phi_{ca}$ and the coarse phase $\phi_{cb}$ start with different voltages for the capacitors $C_{3a}$ and $C_{3b}$, but arrive at about the same voltage level, either the coarse phase $\phi_{ca}$ or the coarse phase $\phi_{cb}$ will finish first depending on the voltage level of the input signal $V_{in}$. As a result, either the coarse phase $\phi_{ca}$ will wait for the coarse phase $\phi_{cb}$ to finish or the coarse phase $\phi_{cb}$ will wait for the coarse phase $\phi_{ca}$ to finish before starting a fine phase that significantly reduces the charging current $I_{1a}$ and that simultaneously reduces the discharging current $I_{1b}$. Completion of the fine phase results in a relatively smaller offset voltage $V_{offseta}$ and a relatively smaller offset voltage $V_{offsetb}$ in comparison to the operation of the level-crossing based circuit 20 of FIG. 5A. As a result, the modified operation of the modified version of the level-crossing based circuit 20 of FIG. 6A is comparatively more accurate. An average of the first output voltage $V_{outa}$ and the second output voltage $V_{outb}$, results in the desired output voltage $V_{out(n)}$. It is to be understood that a variety of traditional averaging circuits (not shown) can be employed as a following stage to average the first output voltage $V_{outa}$ and the second output voltage $V_{outb}$ together.

Those skilled in the art will recognize improvements and modifications to the embodiments of the present disclosure. All such improvements and modifications are considered within the scope of the concepts disclosed herein and the claims that follow.

What is claimed is:

1. A level-crossing based circuit with offset voltage cancellation comprising:
   a first level-crossing detector section having a first output capacitor, and being configured to charge the first output capacitor to a first voltage corresponding to a single input signal, wherein the first voltage includes a first offset voltage; and
   a second level-crossing detector section having a second output capacitor, and being configured to discharge the second output capacitor to a second voltage corresponding to the input signal such that the second voltage includes a second offset voltage that is substantially equal in magnitude to the first offset voltage and opposite in polarity to the first offset voltage relative to an average of the first voltage and the second voltage.

2. The level-crossing based circuit of claim 1 wherein the first level-crossing detector section comprises:
   a first zero-crossing detector having a first virtual ground node input, a first common mode input, and a first zero-crossing detector output; and
   a first output switch coupled to the first output capacitor to selectively interrupt the charging of the first output capacitor once a first voltage sample of the input signal on the first virtual ground node input exceeds a common mode voltage on the first common mode input and wherein the first output switch is controllably coupled to the first zero-crossing detector output.

3. The level-crossing based circuit of claim 2 wherein the second level-crossing detector section comprises:
   a second zero-crossing detector having a second virtual ground node input, a second common mode input, and a second zero-crossing detector output; and
   a second output switch coupled to the second output capacitor to selectively interrupt the charging of the second output capacitor once a second voltage sample of the input signal on the second virtual ground node input falls below a common mode voltage on the second common mode input and wherein the second output switch is controllably coupled to the second zero-crossing detector output.

4. The level-crossing based circuit of claim 1 further including a first current source configured to linearly charge the first output capacitor, and a second current source to linearly discharge the second output capacitor.

5. The level-crossing based circuit of claim 4 wherein the first current source and the second current source are configured to source current at a first relatively high rate and a second relatively low rate.

6. The level-crossing based circuit of claim 5 further including a voltage reference communicably coupled between the first level-crossing detector section and the second level-crossing detector section to control portions of currents sourced by the first current source and the second current source while the first current source and the second current source are sourcing current at the second relatively low rate.

7. The level-crossing based circuit of claim 6 wherein the currents sourced by the first current source and the second current source substantially cancel while passing inside the voltage reference.

8. A method of offset cancellation for a level-crossing based circuit having a first output capacitor and a second output capacitor, the method comprising:
   charging the first output capacitor to a first voltage corresponding to a single input signal, wherein the first voltage includes a first offset voltage; and
   discharging the second output capacitor to a second voltage corresponding to the input signal such that the second voltage includes a second offset voltage that is substantially equal to the first offset voltage and opposite in polarity to the first offset voltage relative to an average of the first voltage and the second voltage.

9. The method of claim 8 wherein the charging of the first output capacitor and the discharging of the second output capacitor are performed linearly.

10. The method of claim 9 wherein the charging of the first output capacitor occurs at a first relatively high rate and then at a second relatively low rate as the first voltage approaches a first sample voltage corresponding to the input signal.

11. The method of claim 9 wherein the discharging of the second output capacitor occurs at a first relatively high rate and then at a second relatively low rate as the first voltage approaches a second sample voltage corresponding to the input signal.

12. A level-crossing based circuit comprising:
   a signal input terminal;
   a first switched capacitor sampling network having a first sampling input terminal coupled to the signal input terminal and a first sampling output terminal;
   a first level-crossing detector having a first virtual ground node input coupled to the first sampling output terminal, a first common mode input, and a first level-crossing detector output;
   a first output capacitor for providing a first output voltage;
   a first current source configured to charge the first output capacitor;
   a first output switch coupled to the first output capacitor to selectively interrupt the charging of the first output capacitor once a first voltage sample of a single input signal on the first virtual ground node input exceeds a common mode voltage on the first common mode input and wherein the first output switch is controllably coupled to the first level-crossing detector output;
   a second switched capacitor sampling network having a second sampling input terminal coupled to the signal input terminal and a second sampling output terminal;
   a second level-crossing detector having a second virtual ground node input coupled to the second sampling output terminal, a second common mode input and a second level-crossing detector output;
   a second output capacitor for providing a second output voltage;
   a second current source configured to discharge the second output capacitor; and
   a second output switch coupled to the second output capacitor to selectively interrupt the discharging of the second output capacitor once a second voltage sample of the input signal on the first virtual ground node input drops below a common mode voltage on the second common mode input and wherein the second output switch is controllably coupled to the second level-crossing detector output.

13. The level-crossing based circuit of claim 12 wherein the second level-crossing detector is configured to discharge the second output capacitor to the second output voltage such that the second output voltage includes a second offset voltage that is substantially equal in magnitude to a first offset voltage of the first output voltage and opposite in polarity to the first offset voltage relative to an average of the first output voltage and the second output voltage.

14. The level-crossing based circuit of claim 12 wherein the first level-crossing detector and the second level-crossing detector are zero-crossing detectors.

15. The level-crossing based circuit of claim 12 wherein the first current source and the second current source are configured to source current at a first relatively high rate and a second relatively low rate.

16. The level-crossing based circuit of claim 15 further including a voltage reference communicably coupled between the first sampling input terminal and the second sampling input terminal to control portions of currents sourced by the first current source and the second current source while the first current source and the second current source are sourcing current at the second relatively low rate.

17. The level-crossing based circuit of claim 16 wherein the currents sourced by the first current source and the second current source substantially cancel while passing inside the voltage reference.

18. The level-crossing based circuit of claim 15 wherein the first level-crossing detector controls the first current source to transition from the first relatively high rate of sourcing current to the second relatively low rate of sourcing current as the first voltage sample of the input signal on the first virtual ground node input approaches near below the common mode voltage.

19. The level-crossing based circuit of claim 15 wherein the second level-crossing detector controls the second current source to transition from the first relatively high rate of sourcing current to the second relatively low rate of sourcing current as the second voltage sample of the input signal on the first virtual ground node input approaches near above the common mode voltage.

20. The level-crossing based circuit of claim 12 wherein the first level-crossing detector and the second level-crossing detector are implemented as nano-scale complementary metal oxide semiconductor (CMOS) technology.

* * * * *